US009806710B2

(12) United States Patent
Flatté

(10) Patent No.: US 9,806,710 B2
(45) Date of Patent: Oct. 31, 2017

(54) VOLTAGE-CONTROLLED MAGNETIC-BASED DEVICES HAVING TOPOLOGICAL INSULATOR/MAGNETIC INSULATOR HETEROSTRUCTURE

(71) Applicant: UNIVERSITY OF IOWA RESEARCH FOUNDATION, Iowa City, IA (US)

(72) Inventor: Michael Flatté, Iowa City, IA (US)

(73) Assignee: UNIVERSITY OF IOWA RESEARCH FOUNDATION, Iowa City, IA (US)

(*) Notice: Subject to any disclaimer, the term of this patent is extended or adjusted under 35 U.S.C. 154(b) by 0 days.

(21) Appl. No.: 15/087,244

(22) Filed: Mar. 31, 2016

(65) Prior Publication Data
US 2017/0288666 A1 Oct. 5, 2017

(51) Int. Cl.
*H03K 17/80* (2006.01)
*H01L 43/06* (2006.01)
*H01L 43/10* (2006.01)
*H01L 43/04* (2006.01)
*H03K 19/18* (2006.01)

(52) U.S. Cl.
CPC ............ *H03K 17/80* (2013.01); *H01L 43/04* (2013.01); *H01L 43/06* (2013.01); *H01L 43/10* (2013.01); *H03K 19/18* (2013.01)

(58) Field of Classification Search
CPC ................................ H03K 17/80; H01L 43/04
See application file for complete search history.

(56) References Cited

U.S. PATENT DOCUMENTS

| | | | | |
|---|---|---|---|---|
| 3,972,035 A * | 7/1976 | Holtzberg | ............... | G01R 33/06 257/30 |
| 4,652,945 A * | 3/1987 | Marchant | ................. | G11B 5/00 360/131 |
| 2012/0138887 A1* | 6/2012 | Zhang | ..................... | H01F 1/401 257/9 |
| 2014/0160835 A1* | 6/2014 | Soree | ..................... | H01L 43/02 365/158 |

* cited by examiner

*Primary Examiner* — Moazzam Hossain
*Assistant Examiner* — Farun Lu
(74) *Attorney, Agent, or Firm* — Talem IP Law, LLP

(57) ABSTRACT

A voltage-controlled magnetic based device is described that includes a magnetic insulator; a topological insulator adjacent the magnetic insulator; and magnetic dopants within the topological insulator. The magnetic dopants are located within an edge region of the topological insulator to inhibit charge current flow in the topological insulator during a switching operation using an applied electric field generating by applying a switching voltage across two electrodes at opposite sides of the topological insulator. Power dissipation due to carrier-based currents can be avoided or at least minimized by the magnetic dopants at the edges of the topological insulator.

13 Claims, 3 Drawing Sheets

VOLTAGE-CONTROLLED MAGNETIC-BASED DEVICES HAVING TOPOLOGICAL INSULATOR/MAGNETIC INSULATOR HETEROSTRUCTURE

This invention was made with government funds under Agreement No. HR0011-13-3-0002 awarded by the Defense Advanced Research Projects Agency (DARPA). The U.S. Government has rights in this invention.

BACKGROUND

Information stored in logic and memory devices has traditionally been in the form of electric charge. Unfortunately, charge can leak over time resulting in the information encoded in the charge to be lost. Magnetic materials offer a storage alternative for logic and memory devices because they can retain their configuration and remain stable indefinitely without additional power.

To make magnetic materials viable for use in devices and circuits, switching mechanisms are being explored. Magnetic materials can be switched in various ways. One mechanism for switching a magnetic material is current-based. In this case, spin polarization is generated by current flow into a material to produce a torque that causes the magnetization of the magnetic material to change direction (Spin Hall Effect). However, this method requires current to flow, consuming a significant quantity of power. Another mechanism for switching a magnetic material is by using voltages, which will not intrinsically dissipate power since the associated current is very small. For this reason, voltage-based magnetization reversal is gaining interest.

BRIEF SUMMARY

A voltage-controlled magnetic based device is provided that has a hybrid multiferroic material structure. A topological insulator/magnetic insulator heterostructure is used to enable voltage-driven magnetization switching with minimal to no charge current flow by the inclusion of magnetic dopants in the topological insulator. Power dissipation due to carrier-based currents can be avoided or at least minimized by the magnetic dopants at the edges of the topological insulator.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

DETAILED DESCRIPTION

A voltage-controlled magnetic based device is provided that has a hybrid multiferroic material structure. A magnetically-doped topological insulator/magnetic insulator heterostructure is used to enable voltage-driven magnetization switching with minimal to no current flow by the inclusion of magnetic dopants in the topological insulator. Power dissipation due to carrier-based currents is avoided or at least minimized by the magnetic dopants at the edges of the topological insulator.

Figure 1:
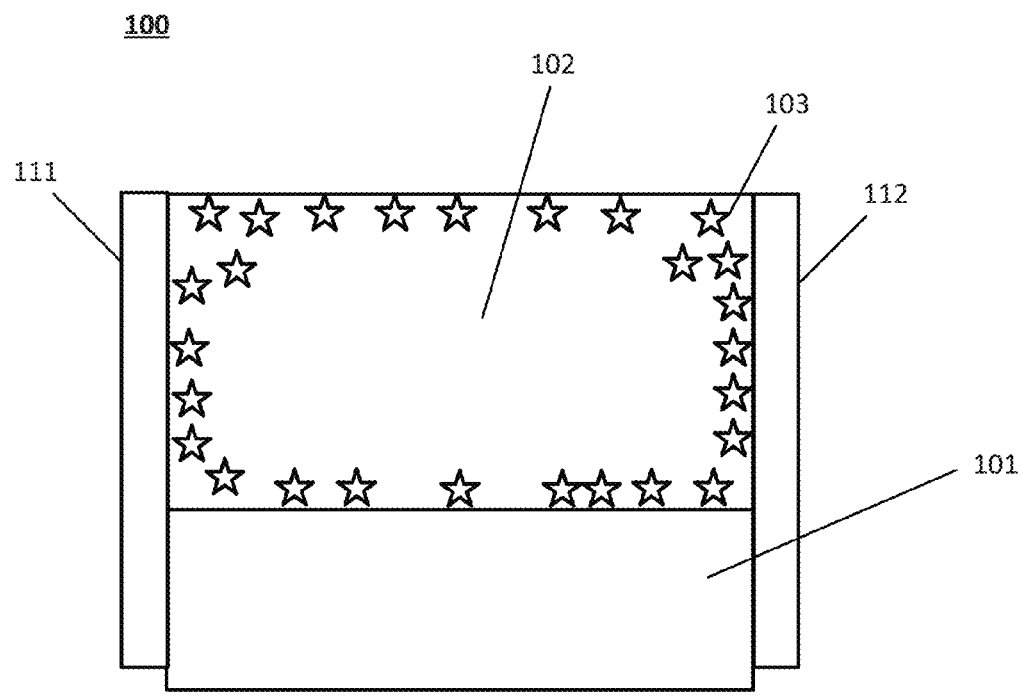
FIG. 1 shows a voltage-controlled magnetic-based device having topological insulator/magnetic insulator heterostructure.

FIG. 1 shows a voltage-controlled magnetic-based device having topological insulator/magnetic insulator heterostructure. Referring to FIG. 1, a magnetic insulator 101 and topological insulator 102 form the basis of a spin-based memory or logic device 100. Magnetic dopants 103 are interspersed at least at the edges of the topological insulator 102. For example, magnetic dopants 103 can be located within an edge region of the topological insulator 102. The edge region may extend from a surface to a depth within the material of between 10 to 20 nm (approximate).

The magnetic insulator can be a ferromagnetic material. In some cases, the magnetic insulator 101 can be a garnet such as yttrium iron garnet (YIG), $(Bi,Y)_3Fe_5O_{12}$ (referred to as Bi:YIG), or $(Ce,Y)_3Fe_5O_{12}$ (referred to as Ce:YIG). The topological insulator 102 can be, for example, bismuth selenide ($Bi_2Se_3$) or bismuth antimony (BiSb). The magnetic dopants 103 can be, for example, chromium (Cr), manganese (Mn), iron (Fe) or other transition metal.

In one embodiment, Cr (as the magnetic dopant 103) is placed in a region within 10-20 nm near the edge of a topological insulator 102 formed of BiSb. The operation of the device can then switch the magnetization direction of the adjacent ferromagnetic material (e.g., garnet).

Since operation of the device 100 is based on an applied electric field, two electrodes 111 and 112 are located at sides of the topological insulator 102. Electrodes 111 and 112 may be formed of any suitable conductive material such as aluminum, copper, platinum, tungsten, gold, or other conductor or stack thereof.

The structure of magnetic insulator 101 and topological insulator 102 with magnetic dopants 103 may be formed in any suitable manner based on manufacturing considerations. For example, the topological insulator 102 can be grown on a layer of the magnetic insulator 101 where the dopants 103 are formed during the growth of the topological insulator 102. Current research prototypes are formed using molecular beam epitaxy. However, any suitable technique may be used. The electrodes 111, 112 can be formed on the sides of the stack. Although used to generate an electric field through the topological insulator 102, the electrodes 111, 112 may contact both the topological insulator 102 and the magnetic isolator 101.

Figure 2A:
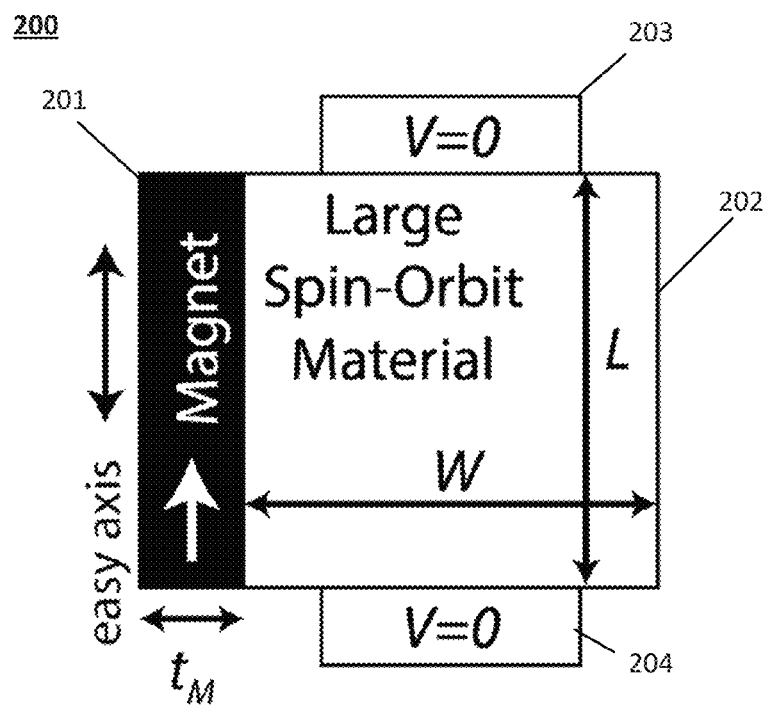
FIGS. 2A-2C show a schematic view of a spin-based memory or logic device according to embodiments described herein undergoing voltage-controlled switching.
Figure 2B:
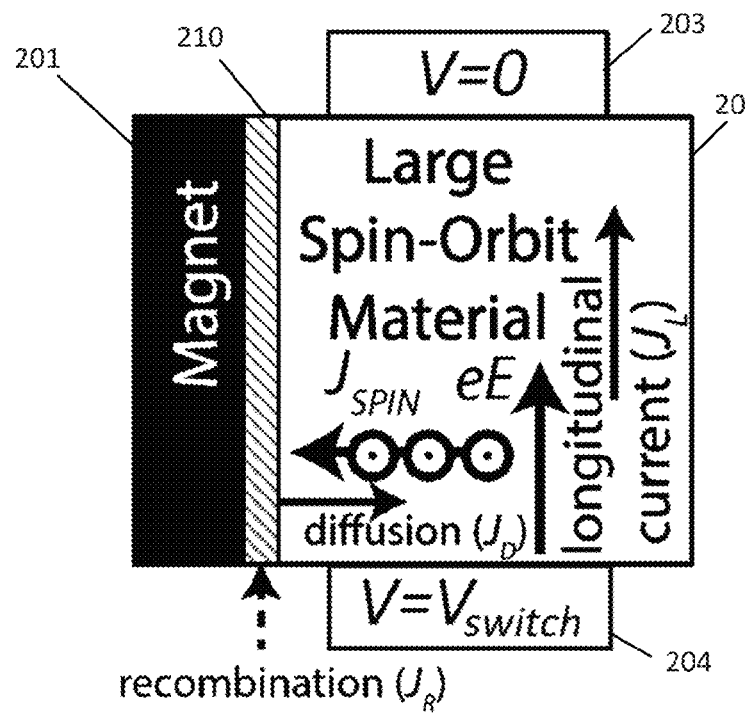
Figure 2C:
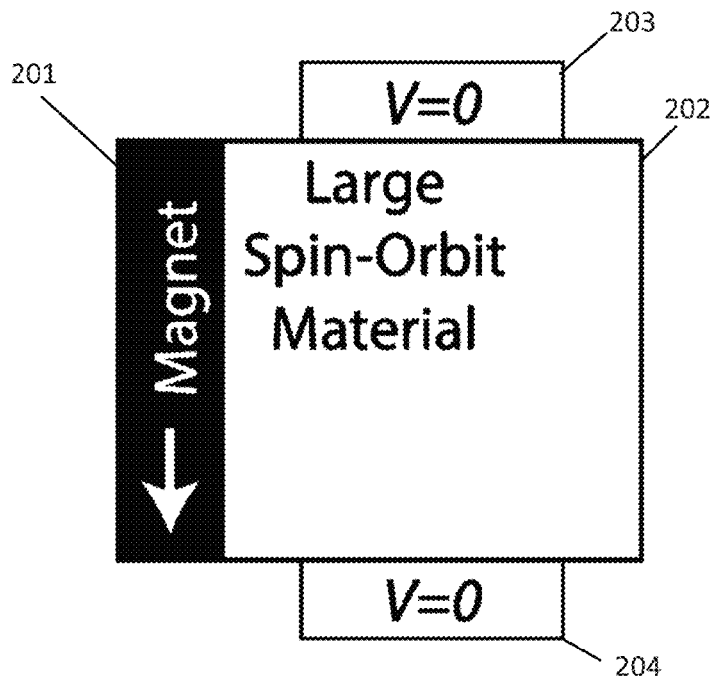

FIGS. 2A-2C show a schematic view of a spin-based memory or logic device according to embodiments described herein undergoing voltage-controlled switching. Referring to FIG. 2A, a device 200 having magnetic material 201 adjacent a magnetic impurity-doped topological insulator 202 can store a first state. This first state is shown as the up arrow along the easy axis in magnetic material 201. The easy axis refers to the crystal axis in the magnetic material along which magnetization is energetically preferred in the absence of external fields. For a voltage-controlled switching of the magnetic material 201, the spin Hall effect in the topological insulator 202 or other large spin-orbit-coupling (SOC) material is used. Ordinarily when a voltage is applied in a charge-based approach, the goal is to accumulate charge in a region sufficient to change the conductivity of that region. Here, since charge accumulation is undesirable, instead of a charge-based approach, an electric field is generated to cause a spin current to flow within the topological insulator 202 with a goal to cause spin accumulation at the interface between the topological insulator 202 and the magnetic material 201. Spin current is carried by the band, not by carriers so there is no electric current through the device 200.

In the absence of an applied voltage, such as shown by the 0V at the two electrodes 203 and 204 in FIG. 2A, it can be seen that there are no net currents and, thus, no dissipation. To operate the device 200 (in a switching operation), an electric field is generated by, for example, applying appropriate voltages (with appropriate frequencies) to each of the two electrodes 203 and 204. In the operation illustrated in FIGS. 2A-2C, the voltage at one of the two electrodes is constant while the voltage (of suitable magnitude) at the other of the two electrodes is switched at a suitable frequency. The applied voltage may be small, for example, 1 V or less, and the switching frequency may be radio or microwave frequencies. The voltage applied is selected to be smaller than the gap created in the edge states (see e.g., gap shown in FIG. 3B), which is material dependent. In many cases, 0.1 V is selected as the applied voltage.

FIG. 2B shows the effects of applying the voltage, $V_{switch}$, across the topological insulator 202 using the two electrodes 203 and 204 to produce an electric field. Referring to FIG. 2B, the voltage generates an electric field (eE), causing a spin current ($J_{SPIN}$) to flow towards the interface between the magnetic material 201 and the topological insulator 202 (transverse the electric field). The spin polarization (region 210) is thus transverse to both the electric field (eE) and the spin current ($J_{SPIN}$).

The major sources of dissipation emerge immediately; one is the longitudinal charge current $J_L$ in the bulk of the topological insulator 202, another is the spin recombination current $J_R$ that occurs at the edge of the magnetic material 201, and finally the spin diffusion current $J_D$ from the spin polarized region 210 at the interface towards the bulk of the topological insulator 202. Advantageously, by including the magnetic dopants at the edges of the topological insulator, the spin diffusion current $J_D$ and the longitudinal charge current $J_L$ become negligible. The magnetic dopants are used to stop edge current and force the device 200 to work via voltage-controlled electric field.

During the operation illustrated in FIG. 2B, the spin current $J_{SPIN}$ generates a chemical potential difference between spins oriented out of the plane of FIG. 2B and those oriented into FIG. 2B, which generates a torque on the spins in the magnetic material 201 through an effective exchange field. This torque causes the magnetization of the magnetic material 201 to precess to point in the opposite direction. FIG. 2C shows the magnetization of the magnetic material 201 pointing in the opposite direction from the initial state in FIG. 2A, completing the illustration of the voltage-controlled magnetization. The magnetization can be reversed by applying an opposite polarity switching voltage (e.g., for a switching voltage having a magnitude of 0.1V, the positive switching voltage is 0.1V and the negative switching voltage (opposite polarity) is −0.1V).

Figure 3A:
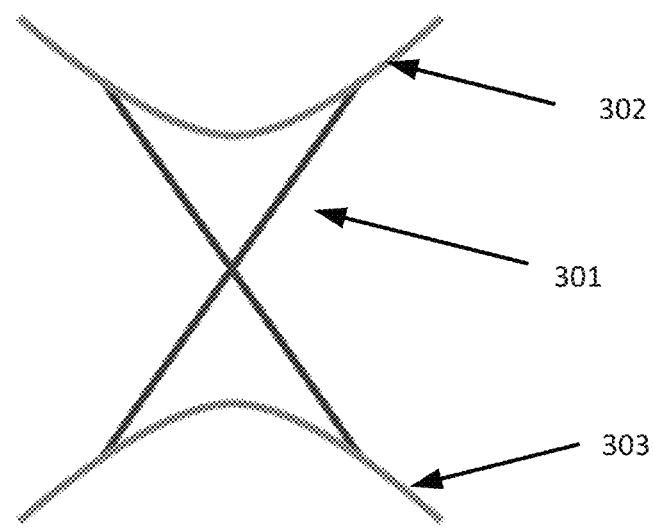
FIGS. 3A and 3B show a Fermi level band structure for a topological insulator without (FIG. 3A) and with (FIG. 3B) magnetic doping.
Figure 3B:
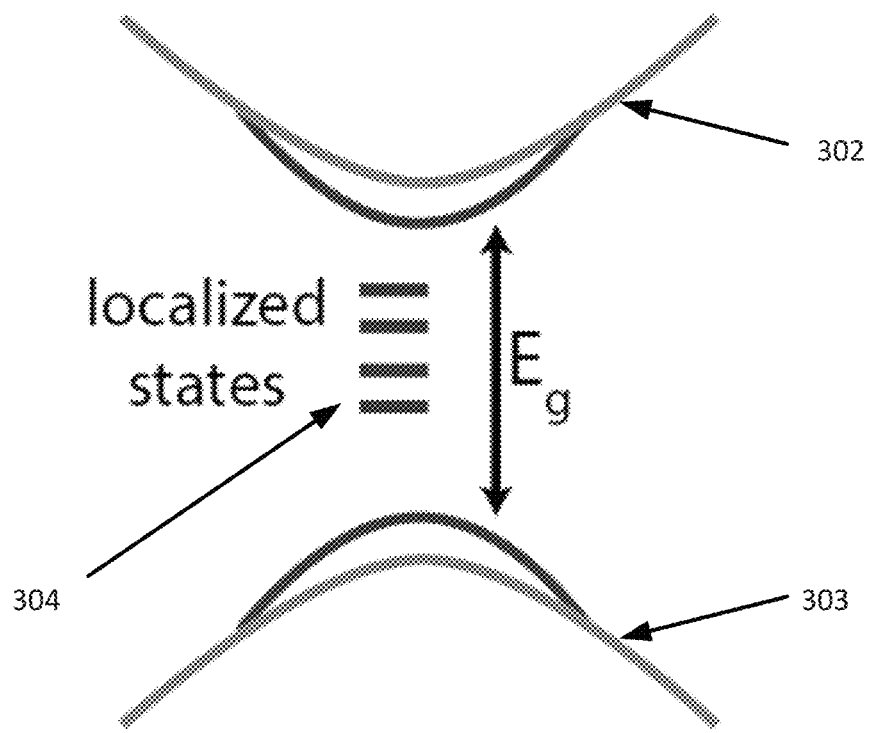

FIGS. 3A and 3B show a Fermi level band structure for a topological insulator without (FIG. 3A) and with (FIG. 3B) magnetic doping. Topological insulators, such as $Bi_2Se_3$ and BiSb, exhibit hybrid material properties by behaving as insulators in their interior while their surface contains conducting states, meaning electrons can only move along the surface. FIG. 3A illustrates the unique feature of topological insulators in which the Fermi level falls within the bulk band gap and is traversed by topologically protected surface states. That is, the surface states are symmetry protected by particle number conservation and time reversal symmetry. Referring to FIG. 3A, extended edge states 301 will dissipate the spin potential and span the bulk energy gap between the conduction band 302 and valence band 303.

As these hybrid multiferroic materials lack conducting states at the chemical potential in their bulk, no dissipative charge currents flow in the bulk in response to an applied voltage. However, surface states at the interface between the topological insulator and the magnetic insulator, if present (for example if the magnetic insulator is topologically trivial) act similarly to surface recombination currents in bipolar devices. Advantageously, the magnetic doping can passivate these surface states.

In particular, as shown in FIG. 3B, the interfaces at the edge of the topological insulator become gapped between the conduction band 302 and valence band 303, and become filled with polarizable localized states 304 that can exert an exchange field on the neighboring ferromagnetic insulator when magnetically doped.

In particular, in order to remove the current that flows in the edges of the topological insulator, magnetic dopants are introduced in the topological insulator at the edge, specifically, within the topological insulator right at the edge where otherwise the edge states would be present. Edge states tend to be confined to the edge region on the order of tens of nanometers and are very peculiar features of topological insulators. Edge states are predicted to occur, and there is strong evidence that they do occur, in the topological insulator where currents flow around the edge of the device naturally. Removing these edge currents enable the voltage-controlled magnetic-based device to avoid the problems associated with power dissipation.

As described with respect to FIG. 2B, it is possible to get spin-polarized currents to flow within a topological insulator. If it is possible to cause these spin-polarized currents to disappear and gap the states that would produce those currents, then the entire process of switching could occur without any substantial current flow and power dissipation.

Example—Evaluation of Switching Behavior

The switching behavior described with respect to FIGS. 2A-2C (where $J_D$ and $J_R$ are reduced to a negligible value) was estimated using calculations involving: (1) the rate at which spins accumulate at the interface with the magnet (at region 210 of FIG. 2B), which is provided by the spin Hall conductivity $\sigma_{SHC}$, and is $\sigma_{SHC}V_{switch}/L$, where L is the length of the topological isolator shown in FIG. 2A; and (2) the dependence on the density of interfacial spins of the exchange field $H_{ex}$ from those spins acting on the magnetic material.

The spin Hall conductivity available from large SOC materials such as topological insulators exceeds 1000 $(\hbar/e)\Omega^{-1}cm^{-1}$. To calculate the exchange field, YIG, which is a ferrimagnet composed of $Fe3+$ spins arranged in octahedral and tetrahedral sites, was used. The approximate exchange field is $H_{ex} \sim 10^4 M$, where M is the volume magnetization of spins. To determine the effect of the nonequilibrium spins, the spins are considered to be distributed in a region approximately 1 nm from the surface of the magnet, and assumed to act only on the top 1 nm region of the magnet. This distance scale is similar to the length scale of interactions within the YIG, and also of the interface states within the topological insulator. From this estimate, it is determined that $$H_{ex} \sim 100 \text{ Tesla} \times \left(\frac{1 \text{ nm}}{t_M}\right) \times n_{spins} \times 1 \text{ nm}^2 \quad (1)$$

where $n_{spins}$ is the areal density of polarized spins at the interface and $t_M$ is the thickness of the magnetic material 201 in FIG. 2A. For a thin magnetic layer $t_M \sim 10$ nm, the speed of the switching associated with precession of the magnetic moment will be $$v \sim 280 \text{ GHz} \times n_{spins} \times \text{nm}^2. \quad (2)$$

Next, the time required to accumulate $n_{spins}$ polarized spins at the interface is calculated. The rate of accumulation of spins at the interface depends on the value of the electric field, and the spin Hall conductivity, so $$\frac{dn_{spins}}{dt} = \frac{\sigma_{SHC}}{\hbar/2} \frac{V_{switch}}{L}. \quad (3)$$

For a typically large value of the spin Hall conductivity associated with a topological insulator, $1000\,(\hbar/e)\Omega^{-1}\text{cm}^{-1}$, and for a voltage drop across L~10 nm, so there is negligible leakage current, $$\frac{dn_{spins}}{dt} = \frac{2 \text{ GHz}}{\text{nm}^2} \frac{V_{switch}}{\text{Volts}}. \quad (4)$$

Assuming that the switching time is approximately equally divided between the exchange field acting and the polarized spins accumulating, the parameters are determined to be $$v_{switch} = 30 \text{ GHz} \left(\frac{V_{switch}}{\text{Volts}}\right)^{1/2}. \quad (5)$$

The energy required to perform this switch depends on the charging energy for the capacitor associated with the drop of the voltage $V_{switch}$ across the distance L. Thus, $$E = \frac{1}{2} C V_{switch}^2 = \frac{\epsilon_0 \epsilon_r A V_{switch}^2}{L}. \quad (6)$$

For an area 10 nm on a side, and Vswitch=1 V, for a switching frequency of 30 GHz, the energy of the switch is $5 \times 10^{19}$ J, corresponding to an energy-delay product of $2 \times 10^{-29}$ Js.

To evaluate the challenge of reaching this limit, the dissipation resulting from $J_D$ and $J_R$ is evaluated. Note that there is no fundamental reason why both $J_D$ and $J_R$ cannot be reduced to essentially zero. The presentation in FIG. 2B is not a steady-state configuration in the absence of the dissipative currents $J_D$ and $J_R$, as $J_{SPIN}$ will continue to accumulate an imbalanced spin population at the interface. The steady-state configuration can be determined by considering the effective electromotive force on the imbalanced spin population. The increased spin density for out-of-plane spins generates a diffusion current away from the interface, and the decreased spin density for into-the-plane spins produces a diffusion current towards the interface. When this diffusion spin current is sufficiently large to cancel the spin current produced by the spin Hall effect then the steady-state condition has been reached, with a steady-state spin polarization at the interface $P_{max}$. The value of $P_{max}$ is also of value when $J_D$ and $J_R$ are non-zero; the effective spin current producing the spin polarization is reduced to $J_{SPIN} - J_R$.

It should be understood that the examples and embodiments described herein are for illustrative purposes only and that various modifications or changes in light thereof will be suggested to persons skilled in the art and are to be included within the spirit and purview of this application.

What is claimed is:

1. A voltage-controlled magnetic-based device, comprising:
   a magnetic material having a first contact plane;
   a topological insulator adjacent the magnetic material at the first contact plane;
   magnetic dopants within the topological insulator;
   a first electrode at one side of the topological insulator at a second contact plane; and
   a second electrode at an opposite side of the topological insulator at a third contact plane, wherein the second contact plane and the third contact plane are orthogonal to the first contact plane.

2. The device of claim 1, wherein the magnetic dopants are located within an edge region of the topological insulator.

3. The device of claim 1, wherein the topological insulator comprises $Bi_2Se_3$.

4. The device of claim 1, wherein the topological insulator comprises BiSb.

5. The device of claim 1, wherein the magnetic dopants comprise chromium.

6. The device of claim 1, wherein the magnetic dopants comprise iron.

7. The device of claim 1, wherein the magnetic material comprises garnet.

8. A method of operating a voltage-controlled magnetic-based device comprising a magnetic material having a first contact plane; a topological insulator adjacent the magnetic material at the first contact plane; magnetic dopants within the topological insulator; a first electrode at one side of the topological insulator at a second contact plane; and a second electrode at an opposite side of the topological insulator at a third contact plane, wherein the second contact plane and the third contact plane are orthogonal to the first contact plane, the method comprising:
   applying a switching voltage across the first electrode and the second electrode to generate an electric field through the topological insulator for a length of time sufficient to change a first magnetization direction of the magnetic material to a second magnetization direction opposite of the first magnetization direction.

9. The method of claim 8, wherein applying the switching voltage comprises applying a constant 0V to the first electrode and a switching voltage to the second electrode.

10. The method of claim 9, wherein the switching voltage is a positive voltage.

11. The method of claim 9, wherein the switching voltage is a negative voltage.

12. The method of claim 9, wherein the switching voltage has a magnitude of 0.1 V to 1 V.

13. The method of claim 12, wherein the switching voltage is applied at a switching frequency of 30 GHz.

* * * * *